United States Patent
Sunderland

Patent Number: 5,846,610
Date of Patent: *Dec. 8, 1998

[54] PRODUCTION OF CARRIERS FOR SURFACE PLASMON RESONANCE

[75] Inventor: Robert Frank Sunderland, Berkhamsted, United Kingdom

[73] Assignee: Clinical Diagnostic Systems, Rochester, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 553,174

[22] Filed: Nov. 7, 1995

Related U.S. Application Data

[63] Continuation of Ser. No. 306,229, Sep. 14, 1994, abandoned.

[30] Foreign Application Priority Data

Oct. 1, 1993 [GB] United Kingdom .................. 9320305

[51] Int. Cl.$^6$ .................................................. C23C 14/02
[52] U.S. Cl. ........................ 427/534; 427/314; 427/404; 427/537; 427/539; 427/573; 427/574; 427/576; 427/578; 427/579
[58] Field of Search .................................... 427/534, 537, 427/539, 573, 574, 576, 578, 579, 314, 404

[56] References Cited

U.S. PATENT DOCUMENTS

| | | | |
|---|---|---|---|
| 2,478,037 | 8/1949 | Brennan | 427/405 X |
| 3,057,046 | 10/1962 | Maarschalk | 427/405 X |
| 3,486,217 | 12/1969 | Congleton et al. | 427/405 X |
| 4,450,187 | 5/1984 | Gestaut | 427/405 X |
| 4,997,278 | 3/1991 | Finlan et al. | 356/128 |
| 5,023,053 | 6/1991 | Finlan | 422/82.05 |
| 5,035,863 | 7/1991 | Finlan | 422/82.05 |
| 5,047,213 | 9/1991 | Finlan et al. | 422/82.11 |
| 5,055,265 | 10/1991 | Finlan | 422/82.05 |
| 5,064,619 | 11/1991 | Finlan | 422/82.05 |
| 5,151,956 | 9/1992 | Bloemer | 385/11 |
| 5,466,481 | 11/1995 | Nishikawa et al. | 427/131 |

*Primary Examiner*—Bernard Pianalto

[57] ABSTRACT

A process for the production of a carrier for surface plasmon resonance analysis comprising:

A) depositing a preparatory layer on a surface, said preparatory layer comprising a metal selected from the group consisting of: nickel, titanium and chromium, wherein said preparatory layer is substantially uniform and has a thickness of 20–40 Angstroms, B) depositing a silver layer on said preparatory layer wherein said silver layer is substantially uniform and has a thickness of 500–600 Angstroms, and C) said carrier is suitable for surface plasmon resonance analysis.

7 Claims, 1 Drawing Sheet

PRODUCTION OF CARRIERS FOR SURFACE PLASMON RESONANCE

This is a continuation of application Ser. No. 08/306,229, filed Sep. 14, 1994, which is hereby incorporated by reference.

FIELD OF THE INVENTION

This invention relates to a process for the production of carriers for surface plasmon resonance (SPR).

BACKGROUND OF THE INVENTION

Surface plasmon resonance or (SPR) is a technique which can be used in the analysis of antibodies which are deposited on surfaces which have been coated with thin films of metal, in particular thin films of silver. SPR based sensors are discussed in a paper by I. Faulkner, W. R. Flavell, J. Davies, R. F. Sunderland and C. S. Nunnerly: "SPR-based sensors studied by electron energy loss spectroscopy and attenuated total reflection"—to be published in J. Electron Spectroscopy, 1993. The manner in which a coating is applied to a surface has important consequences for the subsequent properties of that surface in terms of SPR and control of the coating process is important. At present coating is generally performed by spattering but control is not good. It is important that the films are formed from uniform layers of metal in order to get reproducible SPR. On account of this improved methods for the production of films for SPR are desirable.

SUMMARY OF THE INVENTION

According to the present invention we provide a process for the production of a carrier for surface plasmon resonance analysis (SPR) comprising:

A) depositing a preparatory layer on a surface, the preparatory layer comprising a major proportion of nickel, and B) depositing a silver layer on said preparatory layer.

BRIEF DESCRIPTION OF THE INVENTION

Figure 1:
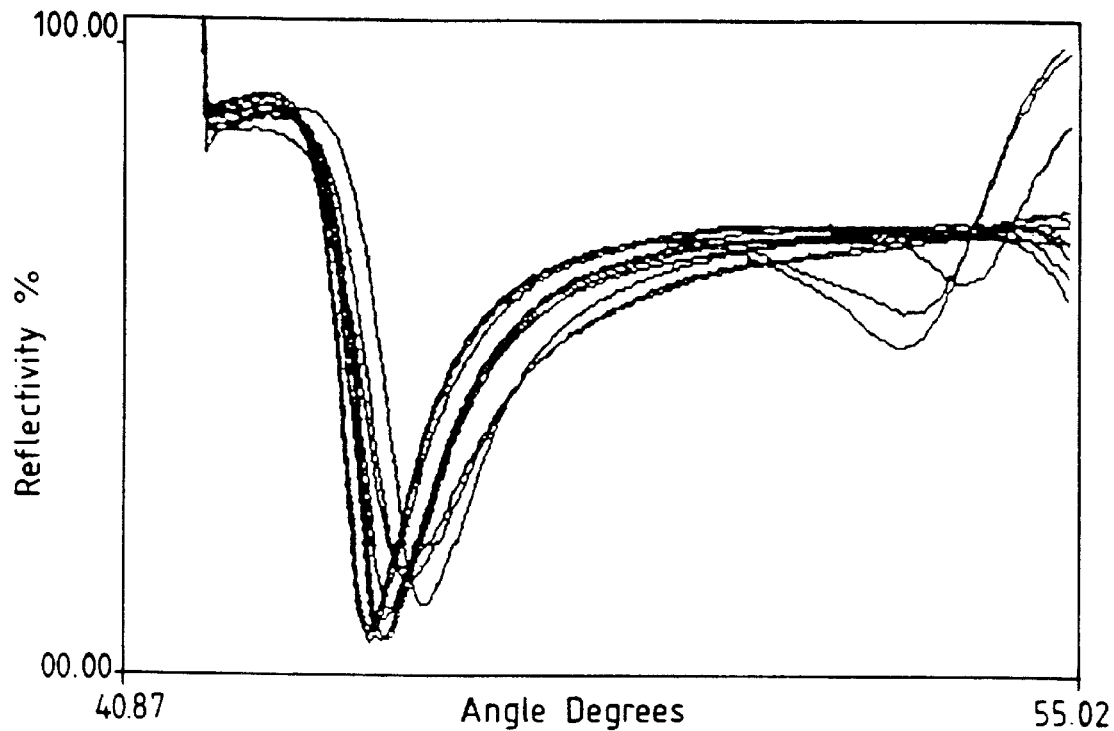
FIG. 1 relates to an air SPR of typically commercially available slides of approximately 410 Å gold (measured by optical density) with assay material removed from the gold surface.

In the preparation of a film for SPR a surface, suitably a glass surface, is subjected to an appropriate pre-treatment before the metallic film is deposited upon it. A suitable pre-treatment comprises the steps of cleaning, followed by treatment with an oxygen-containing gas by the process of the invention. Thereafter a metallic film may be deposited in two steps, a deposit of a lower preparatory layer followed by a deposit of an upper silver layer. After the silver layer has been deposited the film is preferably annealed effectively in order to bake it and thereby orient it and enhance its physical properties.

Preferably the surface is a glass surface. Any suitable glass surface may be used but a preferred surface has a silicon dioxide surface layer. Particularly suitable types of glass are "PERMABLOC" (™) and the earlier product "PERMASHEET" (™) glass, both manufactured by Pilkington Glass of St. Helens, England. These have consistent top layers of silicon dioxide.

In the pre-treatment the glass can be cleaned by treating with a freon and/or by ultrasonic treatment and thereafter with a vapour bath or blow drying.

After cleaning the glass is subjected to treatment with an oxygen-containing gas according to the invention. Any suitable treatment may be used which will cause oxygen ions to enter the surface to an extent sufficient to sensitize it. Preferably the surface is subjected to a reactive glow discharge treatment which suitably uses a mixture of oxygen and an inert gas in particular argon. The surface can be put into a vacuum system in a clean room environment. It may then be subjected to reactive glow discharge using a mixture of oxygen and a rare gas, i.e. a gas from Group 0 of the Periodic Table according to Mendeleev, containing suitably 5% to 15% oxygen. A preferred treatment uses a mixture of argon (90%) and oxygen (10%). The treatment time is suitably 1 to 5 minutes with 2 minutes being preferred. Prior to this procedure the chamber is suitably pumped to a high vacuum. The organic vapour is suitably low or negligible.

When the surface has been treated by the process of the invention a thin preparatory metallic layer is suitably deposited on the glass to form a base for the silver layer. This preparatory layer is suitably formed from titanium, nickel or chromium, nickel being preferred. It is suitably deposited using an electron beam source. Suitably it has a thickness in the range 20 Å to 40 Å, preferably 20 Å to 30 Å and especially 25 Å to 30 Å.

The silver layer is deposited on the preparatory metallic layer, suitably soon and preferably immediately after the latter has been formed. Suitably the silver layer has a thickness in the range 500 Å to 600 Å, preferably 520 Å. This has been energy to enter the surface of the glass and sensitize it. The equipment used was a Temescale 2550 coating system using a Telemark 4 crucible e-gun evaporator with Sycon controller.

After reactive glow discharge treatment the system was repumped to approximately $10^{-7}$ m bar. Then a thin layer of nickel from a 99.9% pure ingot produced by Materials Research Corporation (MCR) was laid down upon the glass surface using an electron beam source. A typical beam current was 60 mA at 10 KeV energy. The layer was 25 Å to 30 Å in thickness. Deposition time was 25 to 30 seconds at 1 Å per second.

Immediately after the layer of nickel had been laid down a layer of silver from a 99.9% pure ingot from MCR was laid upon it using the same technique. A typical beam current was 50 mA at 10 KeV. The silver layer was 520 Å in thickness. Deposition time was 8.5 minutes at 1 Å per second.

After deposit of the silver layer annealing was effected by placing the coated glass surface in a chamber and subjecting it to infra red heating at 150° C. for 4 hours.

The silver coated glass surface produced had a very suitable SPR response.

Figure 2:
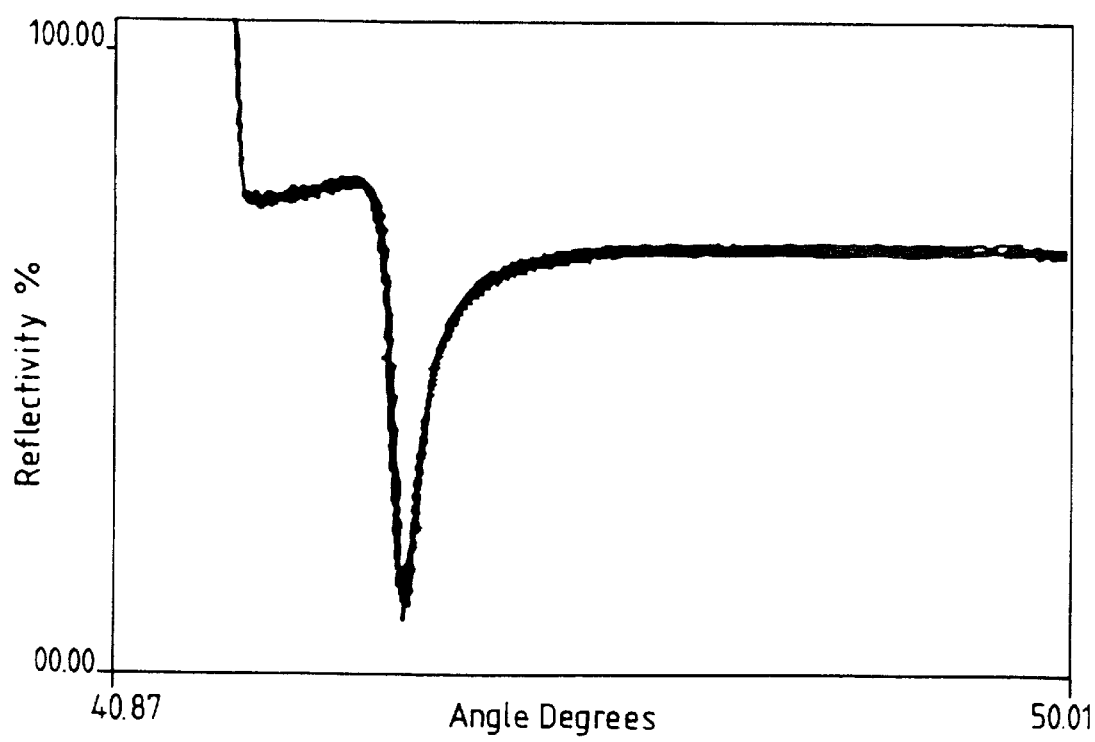
FIG. 2 relates to air SPR and to slides prepared by the process of the invention of approximately 560 Å silver with underlay measured by optical density.

This is illustrated by FIGS. 1 and 2 of the accompanying drawings wherein:

FIG. 1 is a graph of percentage light transmitted against angular position for a conventional commercially available SPR system; and FIG. 2 is a graph of percentage light transmitted against angular position for the system of the Example.

The Figures show that the characteristics produced by the Example are superior, giving a sharper, more distinct minimum in the curve.

This invention has been described in detail with particular reference to the preferred embodiments thereof, but it will be understood that variations and modifications can be effected within the spirit and scope of the invention.

I claim:

1. A process for the production of a carrier for surface plasmon resonance analysis comprising:

A) depositing a preparatory layer on a surface, said preparatory layer comprising a metal selected from the group consisting of: nickel, titanium and chromium, wherein said preparatory layer is substantially uniform and has a thickness of 20–40 Angstroms, B) depositing a silver layer on said preparatory layer wherein said silver layer is substantially uniform and has a thickness of 500–600 Angstroms, and C) said carrier is suitable for surface plasmon resonance analysis.

2. The process of claim 1 further comprising the step of heating said carrier from 1.5 to 4 hours.

3. The process of claim 1 wherein during the heating step the film is heated to a temperature in the range 125° to 175° C.

4. The process of claim 1 wherein before said preparatory layer is deposited, said surface is subjected to a pretreatment comprising the steps of cleaning and treatment by reactive glow discharge.

5. The process of claim 4 wherein said reactive glow discharge treatment uses a mixture of oxygen and argon containing 5% to 15% oxygen.

6. The process of claim 1 wherein said preparatory layer is formed substantially entirely of nickel.

7. The process of claim 1 wherein said surface comprises a silicone dioxide surface layer.

* * * * *